US011922049B2

(12) United States Patent
Benson

(10) Patent No.: US 11,922,049 B2
(45) Date of Patent: Mar. 5, 2024

(54) TRIM VALUES FOR MULTI-PLANE OPERATIONS

(71) Applicant: MICRON TECHNOLOGY, INC., Boise, ID (US)

(72) Inventor: William E Benson, South Lake Tahoe, NV (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/407,845

(22) Filed: Aug. 20, 2021

(65) Prior Publication Data
US 2023/0057614 A1  Feb. 23, 2023

(51) Int. Cl.
*G06F 12/00* (2006.01)
*G06F 3/06* (2006.01)

(52) U.S. Cl.
CPC .......... *G06F 3/0655* (2013.01); *G06F 3/0604* (2013.01); *G06F 3/0653* (2013.01); *G06F 3/0679* (2013.01)

(58) Field of Classification Search
CPC .... G06F 3/0655; G06F 3/0604; G06F 3/0653; G06F 3/0679
See application file for complete search history.

(56) References Cited

U.S. PATENT DOCUMENTS

| 10,642,747 | B1* | 5/2020 | Jagtap | G06F 12/10 |
| 2010/0070693 | A1 | 3/2010 | Conley | |
| 2017/0285969 | A1* | 10/2017 | Madraswala | G06F 3/0659 |
| 2018/0293029 | A1* | 10/2018 | Achtenberg | G11C 29/028 |
| 2018/0322932 | A1 | 11/2018 | Periyannan et al. | |
| 2019/0042356 | A1* | 2/2019 | Chen | G11C 16/26 |
| 2019/0066771 | A1* | 2/2019 | Binfet | G11C 11/419 |
| 2019/0171381 | A1* | 6/2019 | Ioannou | G06F 3/0679 |
| 2019/0227749 | A1* | 7/2019 | Wakchaure | G06F 3/0604 |
| 2019/0391758 | A1* | 12/2019 | Fujiu | G11C 16/0483 |
| 2020/0133510 | A1* | 4/2020 | Koudele | G06F 3/0614 |
| 2020/0133572 | A1 | 4/2020 | Park | |
| 2020/0192735 | A1* | 6/2020 | Ioannou | G06F 3/064 |
| 2021/0090682 | A1* | 3/2021 | Tokutomi | G11C 11/5642 |
| 2022/0129396 | A1* | 4/2022 | Pilolli | G11C 7/1018 |
| 2022/0199156 | A1* | 6/2022 | Sharon | G11C 11/5671 |
| 2022/0317930 | A1* | 10/2022 | Zhi | G06F 3/0659 |

OTHER PUBLICATIONS

PCT International Search Report and Written Opinion for International Application No. PCT/US2022/040946, dated Nov. 28, 2022 10 pages.

* cited by examiner

*Primary Examiner* — Shawn X Gu
*Assistant Examiner* — Mohammad S Hasan
(74) *Attorney, Agent, or Firm* — LOWENSTEIN SANDLER LLP

(57) ABSTRACT

A request is received to perform a multi-plane operation for data residing on a first plane and a second plane of a memory device. A first set of trim values is obtained from a first set of registers of the memory device. The first set of trim values corresponds to a first voltage shift for the data at the first plane. A second set of trim values is obtained from a second set of registers of the memory device. The second set of trim values corresponds to a second voltage shift for the data at the second set of trim values for the data at the second plane. The multi-plane operation is performed using at least the first set of trim values for the data at the first plane and at least the second set of trim values for the data at the second plane.

18 Claims, 7 Drawing Sheets

… (1)

TRIM VALUES FOR MULTI-PLANE OPERATIONS

TECHNICAL FIELD

Embodiments of the disclosure relate generally to memory sub-systems, and more specifically, relate to trim values for multi-plane operations.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
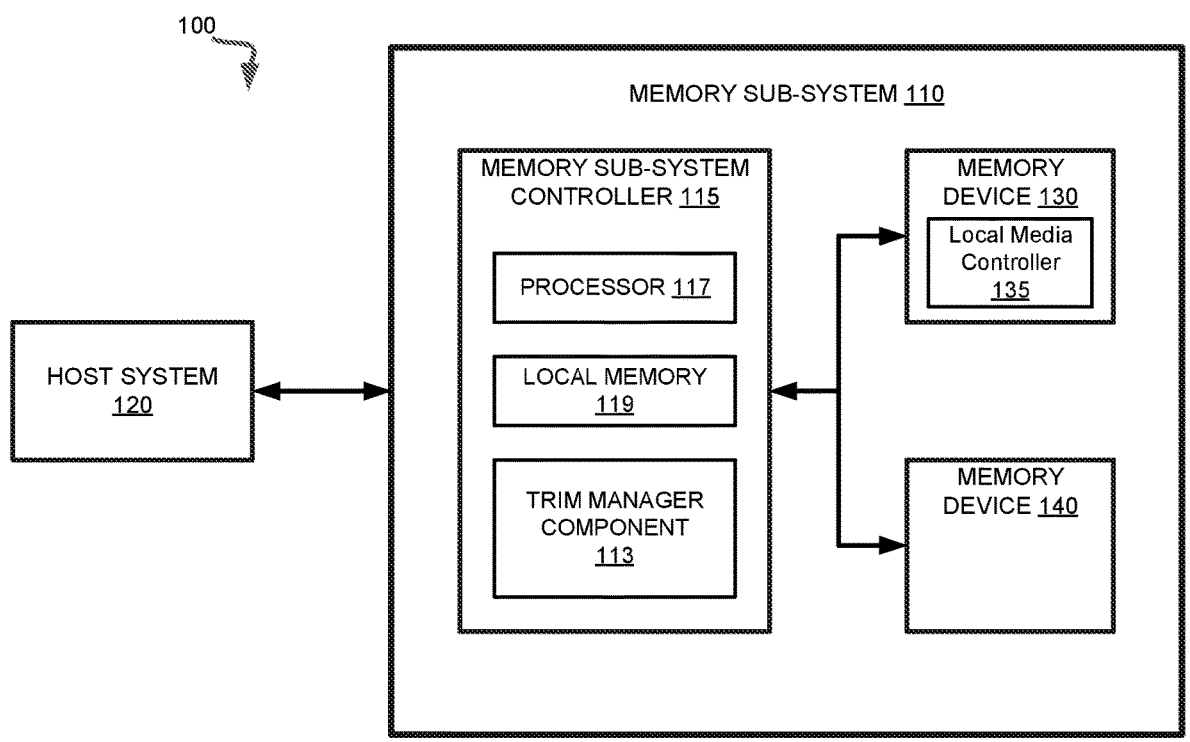
FIG. 1 illustrates an example computing system that includes a memory sub-system, in accordance with some embodiments of the present disclosure.

Aspects of the present disclosure are directed to trim values for multi-plane operations. A memory sub-system can be a storage device, a memory module, or a combination of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can include one or more planes. A plane is a portion of a memory device that includes multiple memory cells. Some memory devices can include two or more planes. In such devices, identical operations can be executed at each plane. Planes can be grouped into logic units (LUN). For some types of non-volatile memory devices (e.g., NAND devices), each plane includes a set of physical blocks. Each block includes a set of pages. "Block" herein shall refer to a set of contiguous or non-contiguous memory pages. An example of a "block" is an "erasable block," which is the minimal erasable unit of memory, while "page" is a minimal writable unit of memory. Each page includes a set of memory cells. A memory cell is an electronic circuit that stores information.

A memory device can be made up of bits arranged in a two-dimensional grid. Memory cells can be etched into a silicon wafer in an array of columns (also hereinafter referred to as bitlines) and rows (also hereinafter referred to as wordlines). A wordline refers to one or more rows of memory cells that are used with one or more bitlines to generate the address of each of the memory cells. The intersection of a bitline and a wordline constitutes the address of the memory cell. A block, which can include one or more pages, can include a group of memory cells, a wordline group, a wordline, or individual memory cells. One or more blocks can be grouped together to form a plane of the memory device in order to enable concurrent operations to take place on each plane. The memory device can include circuitry that performs concurrent memory page access of two or more memory planes. For example, the memory device can include a respective access line driver circuit and power circuit for each plane of the memory device to facilitate concurrent access of pages of two or more memory pages, including different page types.

As described above, a memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. Thus, a read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss or SCL (also referred to as storage charge loss or system charge loss), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

"Trim values" or "trims" refers to voltage offset values to be additively applied to the base read levels for performing a memory access operation with respect to a memory device. A controller of the memory device (i.e., a memory sub-system controller, a memory device controller, etc.) can set the trim values for the memory device prior to execution of an operation in order to improve the bit error rate (BER) levels by loading a set of trim values associated with the operation from a data store (e.g., a non-volatile memory) to a register of the memory device. The behavior of the memory device utilizing the loaded trim values can vary depending on the temporal voltage shift associated with memory cells of the memory device when an operation is executed. Accordingly, the controller of the memory device can load different sets of trim values during a lifetime of the memory device to mitigate errors caused by the SCL phenomenon.

In some instances, different sets of trim values for a memory device can correspond to distinct levels of memory cell granularity that can be subject to a memory access operation. For instance, the controller of the memory device can load a set of trim values that can be used to perform plane-based operations at the memory device (referred to as plane-based trim values) to a register for the memory device that is allocated to store plane-based trim values for all planes at the memory device. Accordingly, the controller of the memory device uses the same plane-based trim values to perform plane-based operations for data residing at each plane of the memory device. However, memory cells of each plane can exhibit a distinct amount of voltage based on the amount of time that has passed since data was programmed to the respective plane (referred to as time after programming or "TAP"). As a result, a plane-based operation performed for data residing at a first plane exhibiting a significant voltage shift can be associated with a different BER (e.g., a higher BER) than for data residing at a second plane exhibiting a smaller voltage shift.

As described above, a memory device can include circuitry that performs concurrent memory page accesses of two or more memory planes (referred to as a multi-plane operation). However, each plane accessed during the multi-plane operation can be associated with a different TAP and therefore can be exhibit a different voltage shift. As the plane-based trim values used to perform the multi-plane operation are the same for each plane, the BER associated with accessing the data residing at one plane accessed during the multi-plane operation can be different from the BER associated with accessing data residing at another plane. In some instances, the BER associated with accessing the data residing at one plane can be high enough to violate performance constraints associated with the memory device. The controller of the memory device (e.g., the memory sub-system controller, the local memory device controller, etc.) can retrieve a different set of trim values and re-perform the plane-based operation using the different trim values. If the BER associated with the re-performance of the plane-based operation is still high, the controller of the memory device can retrieve yet another set of trim values and re-perform the plane-based operation again. In some instances, the controller of the memory device can re-perform the plane-based operation using different trim values until the BER falls below a threshold BER value. However, retrieving additional trim values and re-performing the plane-based operation can take a significant amount of time and can consume a significant amount of system resources (e.g., programming cycles). If the BER associated with performing the multi-plane operation is high enough, the controller of the memory device can additionally or alternatively perform one or more error correction operations to recover the data residing at the plane. However, the performance of such error correction operations can also take a significant amount of time and consume a significant amount of system resources. As a result, an overall memory sub-system latency is increased and an overall memory sub-system efficiency is decreased.

Aspects of the present disclosure address the above and other deficiencies by providing trim values for multi-plane operations. One or more planes at the memory device can be associated with a distinct set of registers for the memory device that is allocated (e.g., during memory device fabrication, during initialization of the memory device at a memory sub-system, during a run-time of the memory sub-system, etc.) to store trim values for the one or more planes. In some embodiments, each set of registers can be allocated for a single plane at the memory device. In other or similar embodiments, each set of registers can be allocated for multiple planes at the memory device. A controller for a memory device (e.g., a memory sub-system controller, a local memory device controller, etc.) can load trim values to each set of registers that corresponds to an voltage shift exhibited by memory cells of an associated plane. In an illustrative example, the controller of the memory device can receive a request to perform a multi-plane operation for data residing on a first plane that is exhibiting a first voltage shift and a second plane that is exhibiting a second voltage shift. A first set of registers can be allocated to the first plane and can be configured to store trim values associated with the first voltage shift. A second set of registers can be allocated to the second plane and can be configured to store trim values associated with the second voltage shift. The controller can obtain the trim values from the first set of registers and a second set of trim values from the second set of registers and can perform the multi-plane operation using the trim values associated with the first voltage shift for the data residing at the first plane and the trim values associated with the second voltage shift for the data residing at the second plane.

The voltage shift exhibited by each plane at the memory device can increase during operation of the memory sub-system. The controller of the memory device can perform the calibration (e.g., in accordance with a calibration protocol) to estimate the voltage shift exhibited by one or more planes at the memory device. In response to determining that a voltage shift measured for a particular plane satisfies a voltage shift criterion (e.g., exceeds a threshold voltage shift), the controller can update trim values stored in a set of registers allocated to the plane to correspond to the measured voltage shift. The controller can use the updated trim values to perform a subsequent multi-plane operation, in some embodiments.

Advantages of the present disclosure include, but are not limited to, reducing the number of errors that can occur during a performance of a multi-plane operation at a memory device. By allocating distinct sets of registers to store trim values associated with one or more planes of the memory device, a controller is able to perform multi-plane operations for the planes using trim values that correspond to the appropriate voltage shift exhibited by the planes. Accordingly, a BER associated with performing multi-plane operations is significantly decreased. In addition, a fewer number of operations are performed to load trim values to registers of the memory device during performance of the multi-plane operations, which reduces the amount of time and resources consumed during the performance of multi-plane operations. Additionally, as the BER associated with performing multi-plane operations is significantly decreased, a fewer number of error correction operations are performed to recover data after performance of multi-plane operations, which further decreases the amount of time and resources consumed at the memory sub-system. The reduction in the amount of time and resources consumed at the memory sub-system decreases an overall memory sub-system latency and increases an overall memory sub-system efficiency.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a trim manager component 113 that can manage trim values for one or more portions of a memory device 130, 140. In some embodiments, the memory sub-system controller 115 includes at least a portion of the trim manager component 113. For example, the memory sub-system controller 115 can include a processor 117 (processing device) configured to execute instructions stored in local memory 119 for performing the operations described herein. In some embodiments, the trim manager 113 is part of the host system 120, an application, or an operating system.

Trim manager component 113 can be configured to manage trim values for each plane at a memory device 130, 140. A "trim value" refers to voltage offset values to be additively applied to the base read levels for performing a memory access operation with respect to memory device 130, 140. A trim value stored in a register allocated for a plane of memory device 130, 140 can affect the behavior of the memory device as a voltage is applied during execution of a memory access operation (e.g., a read operation, etc.) for data residing at the plane. In some embodiments, a trim value used for a particular plane can correspond to an operating characteristic associated with one or more portions of the plane. For example, a trim value used for a plane that is exhibiting a significant voltage shift caused by slow charge loss (SCL) can be different from a trim value used for a plane that is exhibiting a smaller voltage shift. Further details regarding the SCL phenomenon are provided with respect to FIG. 2.

Memory device 130, 140 can include memory registers that are configured to store trim values for portions of memory device 130, 140. In some embodiments, one or more memory registers memory device 130, 140 can be allocated for a particular plane at memory device 130, 140. For example, a first memory register can be allocated for a plane at memory device 130, 140 and a second memory register can be allocated for another plane at memory device 130, 140. In another example, a first memory register can be allocated for two or more planes at memory device 130, 140 and a second memory register can be allocated for two or more additional planes at memory device 130, 140.

In some embodiments, trim manager component 113 can load trim values corresponding to an operating characteristic of a particular plane to a register allocated to that plane. In an illustrative example, data can be programmed to a first plane of memory device 130, 140 at a first time period and at a second plane of memory device 130, 140 at a second time period. Accordingly, the voltage shift exhibited by the first plane (i.e., resulting from SCL at the first plane) can differ from the voltage shift exhibited by the second plane (i.e., resulting from SCL at the second plane). Trim manager component 113 can load a first set of trim values that corresponds to a first voltage distribution for memory cells of the first plane to one or more registers allocated to the first plane. Additionally or alternatively, trim manager component 113 can load a second set of trim values that corresponds to a second voltage distribution for memory cells of the second plane to a register allocated to the second plane. In some embodiments, a component of memory sub-system controller 115 (e.g., trim manager component 113, etc.) can receive a request (e.g., from host system 120) to perform a multi-plane operation (e.g., a multi-plane read operation, etc.) for data residing on the first plane and the second plane of memory device 130, 140. In such embodiments, memory sub-system controller 115 can perform the multi-plane operation using the first set of trim values (i.e., obtained from the one or more registers allocated to the first plane) for the data residing at the first plane and the second set of trim values (i.e., obtained from the one rom reo registers allocated to the second plane) for the data residing at the second plane. Further details regarding the trim values for multi-plane operations are provided with respect to FIGS. 3-6 herein.

Figure 2:
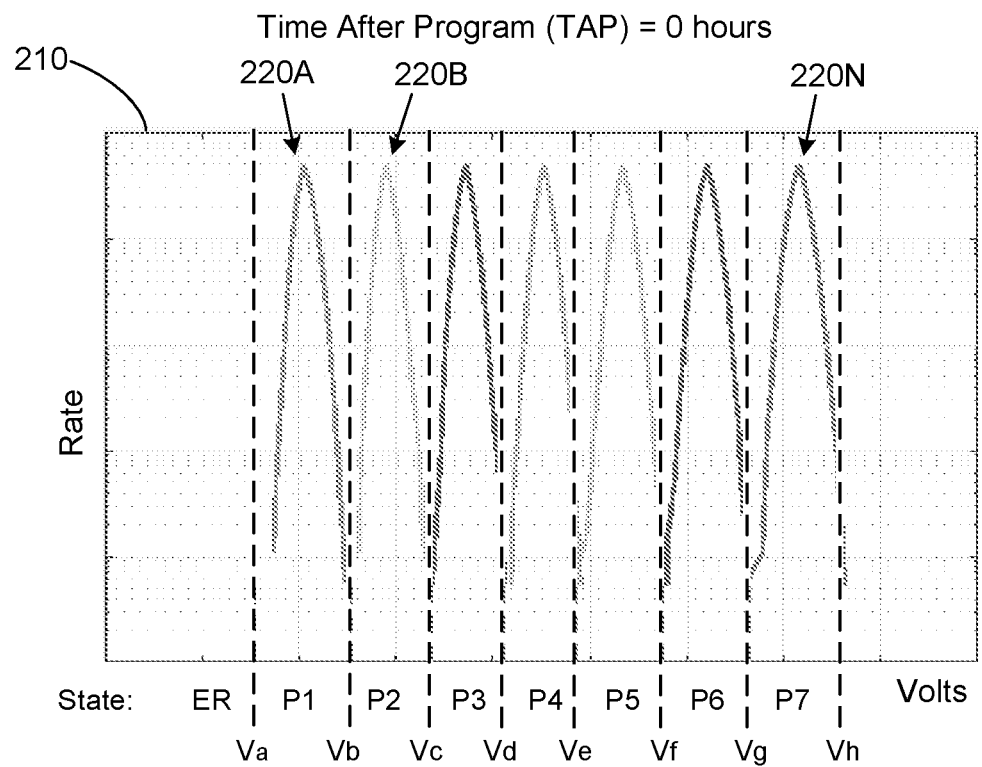
FIG. 2 schematically illustrates the temporal voltage shift caused by the slow charge loss exhibited by triple-level memory cells, in accordance with some embodiments of the present disclosure.
Figure 2:
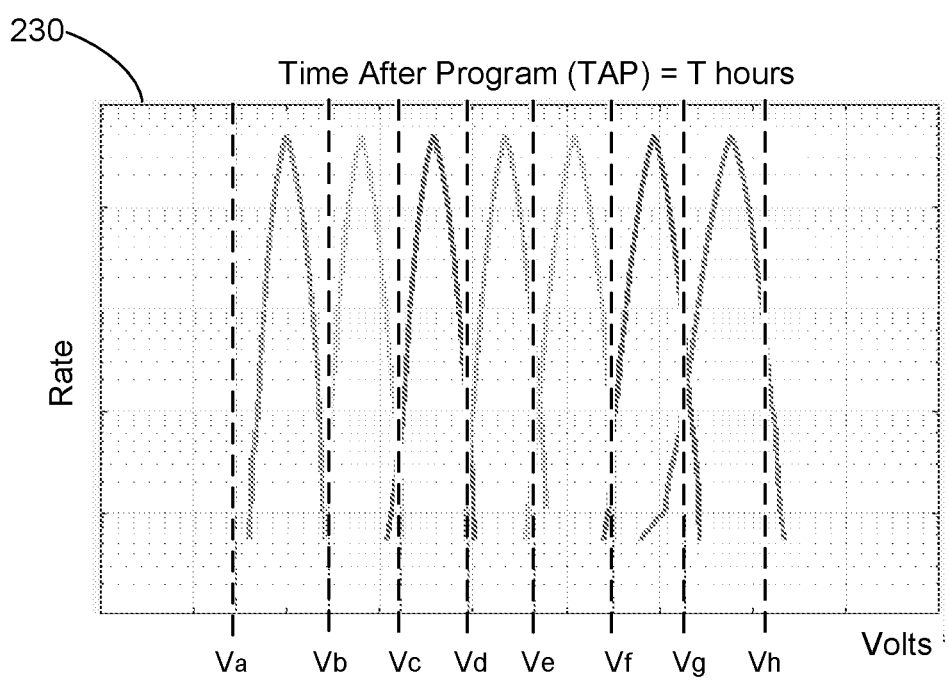

FIG. 2 schematically illustrates the temporal voltage shift caused by the slow charge loss exhibited by triple-level memory cells, in accordance with some embodiments of the present disclosure. While the illustrative example of FIG. 2 utilizes triple-level cells, the same observations can be made and, accordingly, the same remedial measures are applicable to single level cells and multi-level cells, as well as any other fractional or whole number of bits per cell (e.g., 3.5 bits per cell, etc.), in order to compensate for the slow charge loss.

As noted above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph 220A-220N shows a voltage distribution produced by memory cells programmed by a respective write level (which can be assumed to be at the midpoint of the distribution) to encode a corresponding logical level (e.g., "000" through "111" in case of a TLC). In order to distinguish between neighboring distributions (corresponding to two different logical levels), the read threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions. As seen from comparing example charts 210 and 230, which reflect the time periods immediately after programming and a respective number of hours after programming, respectively, the voltage distributions change in time due to the slow charge loss, which results in drifting values of the read threshold voltage levels, which are shown by dashed vertical lines.

Figure 3:
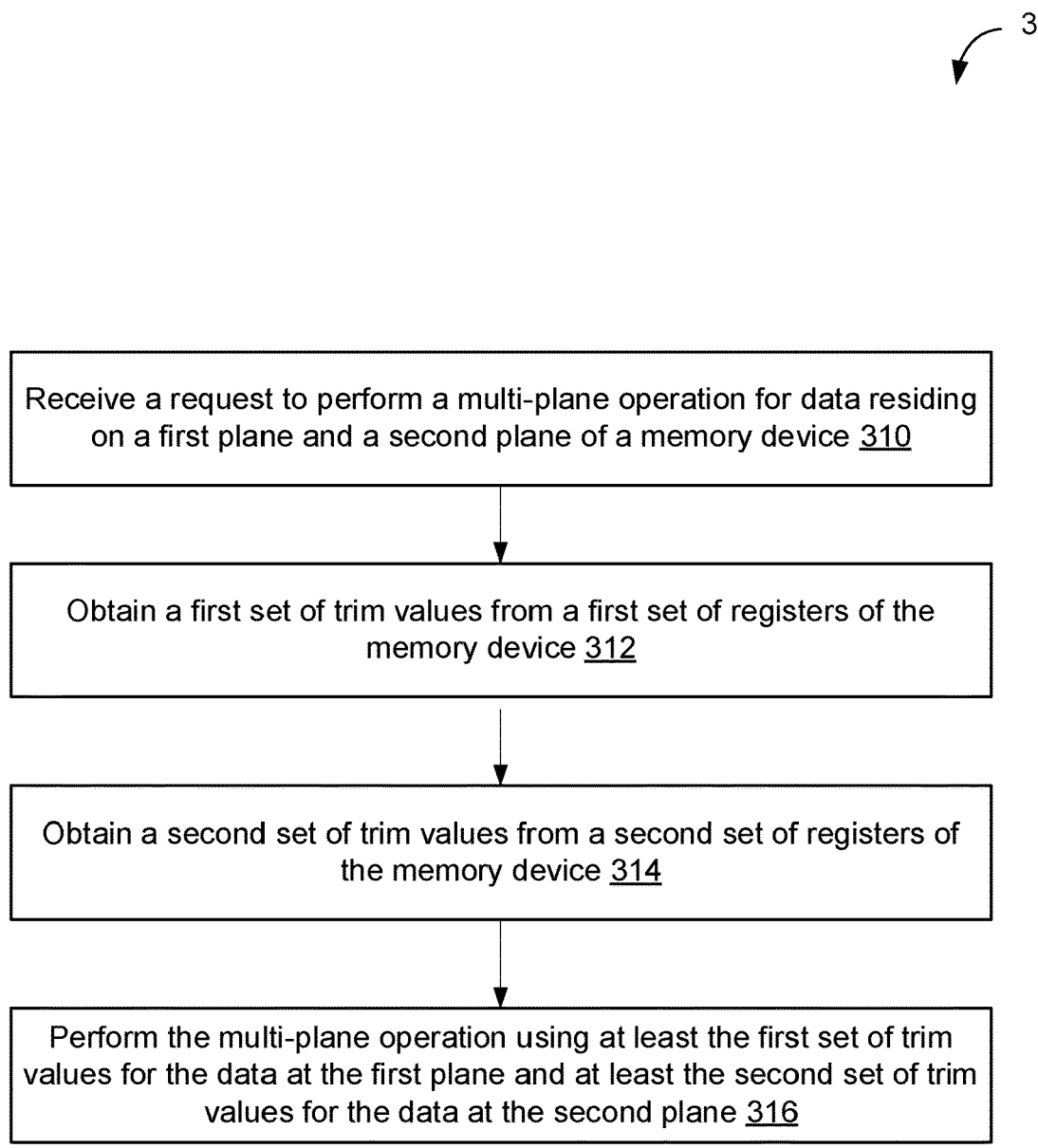
FIG. 3 is a flow diagram of an example method for using trim offsets for multi-plane operations, in accordance with some embodiments of the present disclosure.

FIG. 3 is a flow diagram of an example method 300 for using trim values for multi-plane operations, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the trim manager component 113 of FIG. 1. In other or similar embodiments, one or more operations of method 300 is performed by another component of the memory sub-system controller 115, or by a component of local media controller 135. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 4A:
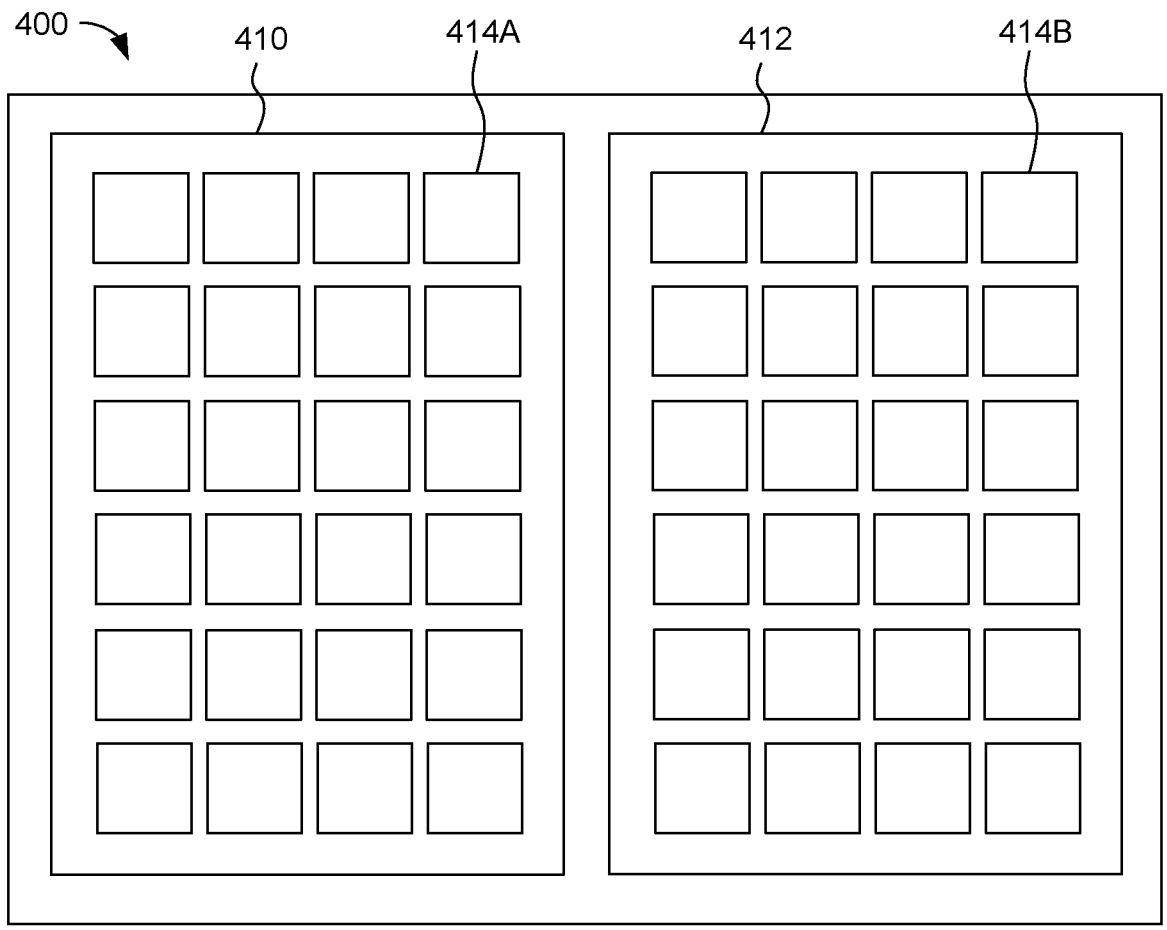
FIGS. 4A-4B depicts an example of trim offsets for multi-plane operations at a memory device, in accordance with some embodiments of the present disclosure.

At operation 310, processing logic receives a request to perform a multi-plane operation for data residing on a first plane and a second plane of a memory device. FIG. 4A depicts an example portion 400 of a memory device 130, 140 that includes a first plane 410 and a second plane 412. As described above, a memory device can include one or more dice and each die can include one or more planes. In some embodiments, each plane can include one or more blocks that each include a set of pages. Each page includes a set of memory cells. As illustrated in FIG. 4A, first plane 410 and second plane 412 can each include one or more memory pages 414 configured to store data (e.g., host data). It should be noted that although first plane 410 and second plane 412 are depicted in FIG. 4A include one or more memory pages 414, embodiments of the present disclosure are applicable to any groupings of memory cells at a plane or memory device (e.g., blocks, cells, etc.).

In some embodiments, circuitry for portion 400 of memory device 130, 140 can be configured to execute operations to concurrently access memory pages at two or more planes. Such operations are referred to as multi-plane operations. In some embodiments, a multi-plane operation can include a multi-plane programming operation (i.e., an operation to program memory pages at two or more planes of memory device 130, 140). In other or similar embodiments, a multi-plane operation can include a multi-plane read operation (i.e., an operation to read data at memory pages at two or more planes of memory device 130, 140). For example, circuitry for portion 400 can be configured to perform a multi-plane read operation to read data of memory page 414A at plane 410 and memory page 414B at plane 412.

Figure 5A:
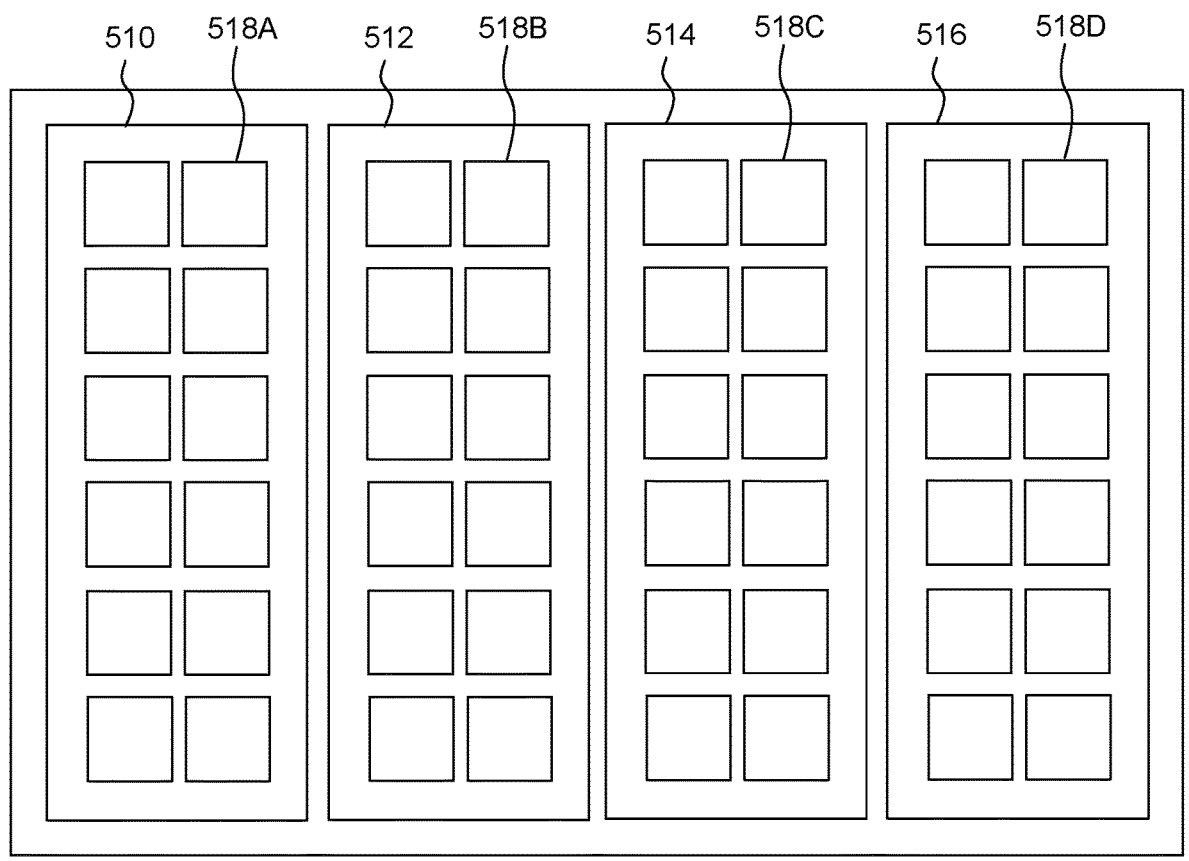
FIGS. 5A-5B depicts an example of trim offsets for multi-plane operations at a memory device, in accordance with some embodiments of the present disclosure.

FIG. 5A depicts another example portion 500 of memory device 130, 140 that includes a first plane 510, a second plane 512, a third plane 514, and a fourth plane 516. In some embodiments, planes 510, 512, 514, and/or 516 can include one or more memory pages 518 configured to store data (e.g., host data). Although planes 510, 512, 514, and 516 are depicted in FIG. 5A as including a fewer number of pages than planes 410 and 412 in FIG. 4A, it should be noted that in some embodiments, planes 510, 512, 514 and/or 516 can include the same number of pages or more pages than planes 410 and/or 412. Circuitry for portion 500 of memory device 130, 140 can be configured to execute multi-plane operations, as described previously. For example, circuitry for portion 500 can be configured to perform a multi-plane read operation to read data of two or more of: memory pages 518A at first plane 510, memory page 518B at second plane 512, memory page 518C at third plane 514, or memory page 518D at fourth plane 516.

In some embodiments, data programmed to one or more planes of memory device 130, 140 can be programmed at a different time period than other planes of memory device 130, 140. For example, memory sub-system controller 115 can program data at first plane 410 at a first time period and data at second plane 412 at a second time period that is subsequent to the first time period. Trim manager component 113 can receive the request to perform a multi-plane operation at a third time period that is subsequent to the first and second time periods. In some embodiments, the voltage distribution for memory cells at first plane 410 at the third time period can be different from the voltage distribution for memory cells at second plane 412. The difference in the voltage distribution at the first plane 410 and the second plane 412 can be due to the different voltage shift exhibited by the first plane 410 and the second plane 412 since the first time period and the second time period, respectively.

Figure 4B:
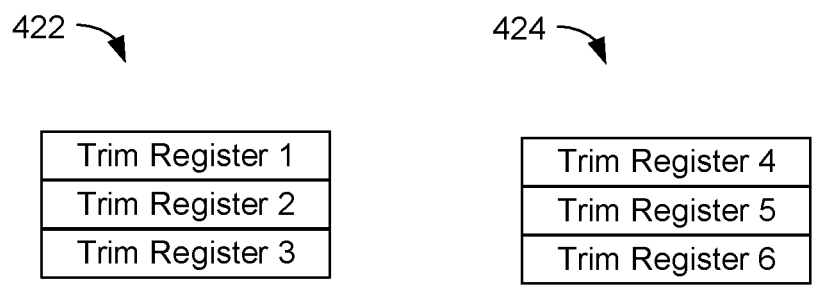

Referring back to FIG. 3, at operation 312, processing logic obtains a first set of trim values from a first set of registers of the memory device. At operation 314, processing logic obtains a second set of trim values from a second set of registers of the memory device. FIG. 4B depicts a first set of registers 422 and a second set of registers 424 for memory device 130, 140. In some embodiments, registers 422 and/or registers 424 can reside on memory device 130, 140, as described above. In one example, registers 422 can be allocated to store trim values for first plane 410 and registers 424 can be allocated to store trim values for second plane 412. In some embodiments, registers 422 and/or registers 424 can be allocated to respective planes 410, 412 before installation and/or initialization of memory device 130, 140 at memory sub-system 110. For example, during fabrication of memory device 130, 140, registers 422 can be allocated to store trim values for first plane 410 and registers 424 can be allocated to store trim values for second plane 412 (e.g., by a programmer, a developer, an engineer, etc.).

In other or similar embodiments, registers 422 and/or registers 424 can be allocated to respective planes 410, 412 after installation and/or initialization of memory device 130, 140 at memory sub-system 110. In some embodiments, trim manager component 113 can allocate a one or more registers to a particular plane responsive to data being programmed to that plane. For example, registers 422 and/or registers 424 can be free for allocation to one or more planes of memory device 130, 140 after an initialization of memory device 130, 140 at memory sub-system 110. At a first time period, memory sub-system controller 115 can program data to first plane 410, as described above. Responsive to memory sub-system controller 115 programming data to first plane 410, trim manager component 113 can allocate registers 422 to store trim values for first plane 410. At a second time period, memory sub-system controller 115 can program data to second plane 412, as described above. Trim manager component 113 can allocate registers 424 to store trim values for second plane 412 responsive to memory sub-system controller 115 programming data to second plane 412, in some embodiments. In other or similar embodiments, trim manager component 113 can allocate one or more registers to a particular plane at other time periods. For example, trim manager component 113 can allocate registers 422 to first plane 410 and/or registers 424 to second plane 412 during an initialization of memory device 130, 140 at memory sub-system 110.

Figure 5B:
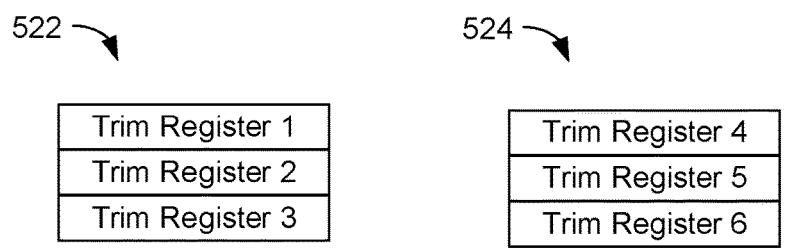

Although some embodiments provided herein describe trim manager component 113 allocating one or more registers to store trim values for a single plane of memory device 130, 140 (e.g., registers 422 to first plane 410 and/or registers 424 to second plane 412), in some embodiments, trim manager component 113 can allocate one or more registers to store trim values for multiple planes of memory device 130, 140, in some embodiments. For example, as described with respect to FIG. 5A, a portion 500 of memory device 130, 140 can include, in some embodiments, a first plane 510, a second plane 512, a third plane 514, and a fourth plane 516. After an initialization of memory device 130, 140 at memory sub-system 110, memory sub-system controller 115 can program data to first plane 510 at a first time period and data to second plane 512 at a second time period. In some embodiments, the second time period can be significantly close to the first time period. For example, a portion of the second time period can overlap with the first time period. In such embodiments, the amount of slow charge loss exhibited by first plane 510 and second plane 512 can be substantially similar. Accordingly, trim manager component 113 can allocate a first set of registers 522 (e.g., as illustrated in FIG. 5B) to first plane 510 and second plane 512. In another example, memory sub-system controller 115 can program data to third plane 514 at a third time period and data to fourth plane 516 at a fourth time period. Responsive to determining that a portion of the fourth time period overlaps with the third time period, trim manager component 113 can allocate a second set of registers 444 to store trim values for third plane 514 and fourth plane 516, in accordance with previously described embodiments.

In some embodiments, trim manager component 113 can allocate a set of registers to multiple planes even though the time periods that each plane was programmed do not overlap. For example, the second time period (i.e., at which memory sub-system controller 115 programmed data to second plane 512) can begin after the first time period (i.e., at which memory sub-system controller 115 programmed data to first plane 510) ends. Responsive to determining that the amount of time between the end of the first time period and the beginning of the second time period satisfies a time period criterion, trim manager component 113 can allocate registers 522 to both plane 510 and plane 512. In some embodiments, trim manager component 113 can determine that the amount of time between the end of the first time period and the beginning of the second time period responsive to determining that the amount of time falls below a threshold value. The threshold value can be determined based on experimental data and/or data collected for memory device 130, 140 (or another memory device 130, 140 at memory sub-system) during runtime, in some embodiments. Responsive to determining that the amount of time between the end of the first time period and the beginning of the second time period does not satisfy the amount of time criterion (e.g., falls below the threshold value), trim manager component 113 can allocate registers 522 to plane 510 and another set of registers for memory device 130, 140 to plane 512 (e.g., registers 524 or other registers for memory device 130, 140), as illustrated in FIG. 5B.

Referring back to FIG. 3, processing logic can obtain the first set of trim values from the first set of registers (e.g., registers 422, registers 522, etc.) and the second set of trim values from the second set of registers (e.g., registers 424, registers 524, etc.) based on an address associated with each respective set of registers. For example, the request to perform the multi-plane operation can include, in some embodiments, an address for each set of registers allocated to the first plane and the second plane. In other or similar embodiments, the address associated with each respective set of registers can be stored at another portion of memory device 130, 140 and is referenced (e.g., by firmware) during execution of a plane-based operation at memory device 130, 140. In some embodiments, each register of the first set of registers and the second set of registers can be associated with a distinct memory address. In other or similar embodiments, each register of the first set of registers can be associated with the same memory address, except for one or more memory address bits that indicate registers that store distinct trim values associated with a respective plane. For example, registers 422 can be allocated to store trim values for first plane 410. Memory cells at plane 410 can be TLCs, in some embodiments. Accordingly, registers 422 can store seven distinct trim values for the memory cells at plane 410 (e.g., one trim value for each logical level associated with a TLC, excluding the base level). The memory address for each register of the first set of registers 422 can be the same, except for one or more bits of the memory address that indicate the distinct trim value (i.e., associated with a distinct logical level) stored at the respective register.

At operation 316, processing logic performs the multi-plane operation using at least the first set of trim values for the data at the first plane and at least the second set of trim values for the data at the second plane. As described above, in some embodiments, each trim value stored at the first set of registers and the second set of registers can correspond to a threshold voltage that is to be applied to memory cells of the first plane and second plane that stores the data referenced by the operation. In such embodiments, processing logic can perform the multi-plane operation by applying a first threshold voltage to memory cells storing the referenced data at the first plane, in accordance with the first set of trim values, and applying a second threshold voltage to memory cells storing the referenced data at the second plane, in accordance with the second set of trim values.

In some embodiments, processing logic can perform the multi-plane operation using one or more additional sets of trim values for the data at the first plane and the data at the second plane. The one or more additional sets of trim values can correspond to other phenomenon that causes voltage shift at memory cells of a memory device. In some embodiments, the voltage shift for memory cells can be further dependent on a difference between a temperature of the memory device at a time period at which data was programmed to the memory cells and a temperature of the memory device at a time period at which data is read from the memory cells (referred to herein as a cross-temperature of the memory cells). For example, if the cross-temperature associated with memory cells is large, the memory cells can exhibit a larger voltage shift than if the cross-temperature associated with the memory cells is small.

In an illustrative example, memory device 130, 140 can be at a first temperature at the first time period (i.e., when data is programmed at first plane 410) and at a second temperature at the second time period (i.e., when data is programmed at second plane 412). Processing logic can receive the request to perform the multi-plane operation at a third time period when the memory device 130, 140 is at a third temperature (also referred to as a current temperature herein). Processing logic can determine a first temperature difference between the current temperature and the first temperature of memory device 130, 140 and a second temperature difference between the current temperature and the second temperature of memory device 130, 140 in some embodiments. In some embodiments, the first temperature difference can correspond to (i.e., is equal to or approximately equal to) the second temperature difference. Accordingly, the determined first and second temperature differences can correspond to the cross-temperature associated with the memory cells at both the first plane 410 and the second plane 412. In other or similar embodiments, the first temperature is different from the second temperature (e.g., a difference between the first temperature and the second temperature exceeds a threshold value). In such embodiments the first temperature difference can correspond to the cross-temperature associated with the memory cells at the first plane 410 and the second temperature difference can correspond to the cross-temperature associated with the memory cells at the second plane 412.

Processing logic can obtain one or more sets of trim values associated with the cross-temperature determined for memory cells at the first plane 410 and/or the second plane 412. For example, in some embodiments, a third set of registers can be allocated (e.g., during memory sub-system fabrication, during initialization of memory device 130, 140, etc.) to store trim values for memory device 130, 140 that correspond to memory cell cross-temperatures. As described above, in some embodiments, the cross-temperature associated with the memory cells at the first plane 410 can correspond to the cross-temperature associated with the memory cells at the second plane 412. In such embodiments, processing logic can obtain, from the third set of registers, a third set of trim values that corresponds to the cross temperature associated with first plane 410 and second plane 412. Processing logic can further perform the multi-plane operation for the data at the first plane 410 and the data at the second plane 412 using the third set of trim values, in some embodiments. For example, processing logic can perform the multi-plane operation for the data at the first plane 410 using the first set of trim values and the third set of trim values and for the data at the second plane 412 using the second set of trim values and the third set of trim values.

In other or similar embodiments, the memory cells at the first plane 410 can be associated with a first cross-temperature and the memory cells at the second plane 412 can be associated with a second cross-temperature. Processing logic can obtain a third set of trim values (e.g., from the third set of registers) associated with the first cross-temperature and a fourth set of trim values (e.g., from the third set of registers or from another set of registers) associated with the second cross-temperature. Processing logic can further perform the multi-plane operation for the data at the first plane 410 using the third set of trim values and the data at the second plane 412 using the fourth set of trim values. For example, processing logic can perform the multi-plane operation for the data at the first plane 410 using the first set of trim values and the third set of trim values and for the data at the second plane 412 using the second set of trim values and the fourth set of trim values.

Figure 6:
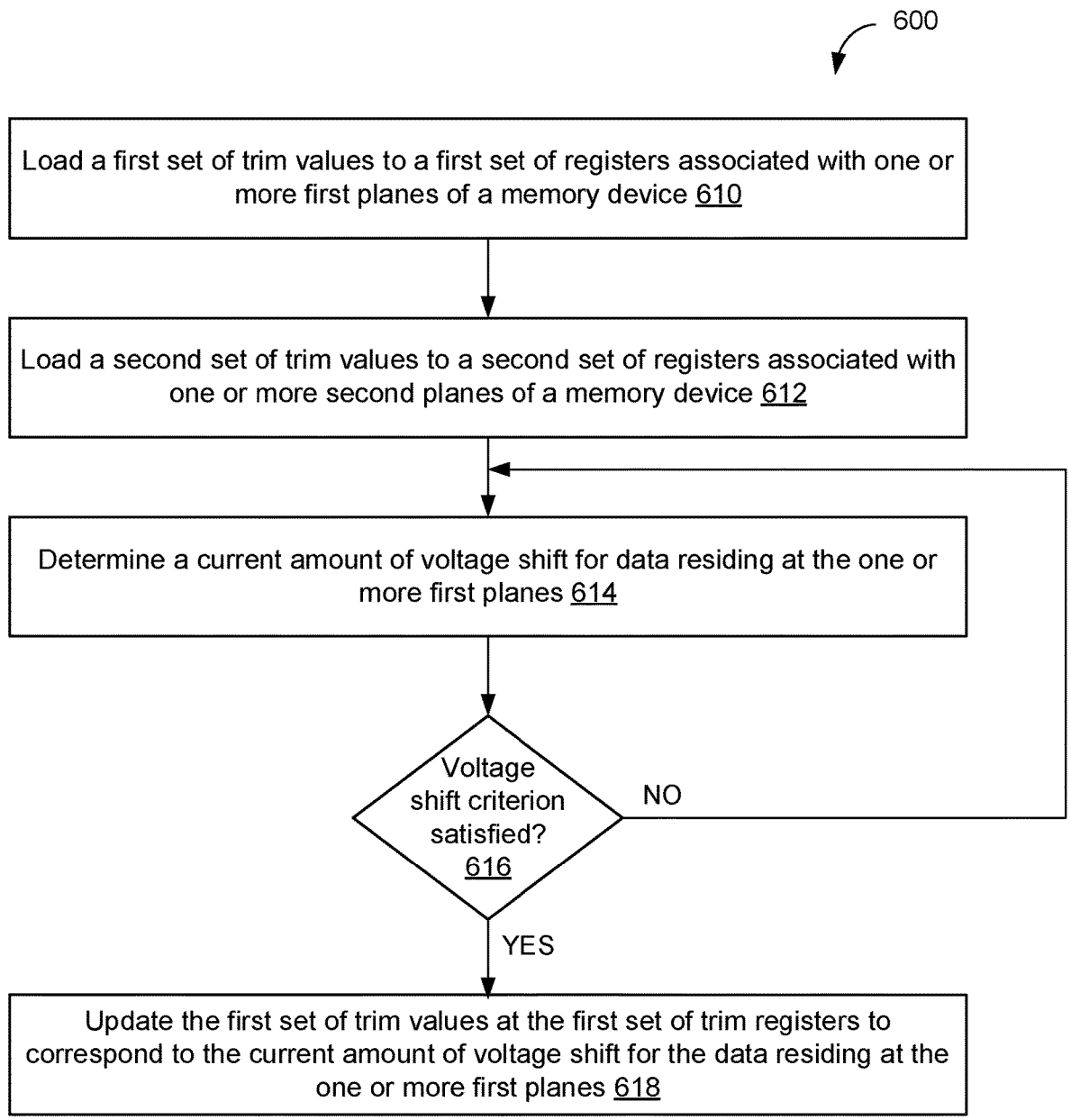
FIG. 6 is a flow diagram of an example method for updating trim offsets for multi-plane operations, in accordance with some embodiments of the present disclosure.

FIG. 6 is a flow diagram of an example method 600 for updating trim offsets for multi-plane operations, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the block family manager component 113 of FIG. 1. In other or similar embodiments, one or more operations of method 600 is performed by another component of the memory sub-system controller, or by a component of local media controller 135. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, processing logic loads a first set of trim values to a first set of registers associated with one or more first planes of a memory device. In some embodiments, first plane 410 described with respect to FIG. 4 can be included in the one or more first planes of memory device 130, 140. At operation 620, processing logic loads a second set of trim values to a second set of registers associated with one or more second planes of a memory device. In some embodiments, second plane 412 can be included in the one or more second planes of memory device 130, 140. As described above, trim manager component 113 can allocate a first set of registers 422 to first plane 410 and a second set of registers 424 to second plane 412. In some embodiments, trim manager component 113 can allocate registers 422 and registers 424 to planes 410 and 412, respectively, after data is programmed to planes 410 and 412. In such embodiments, trim manager component 113 can load trim values to registers 422 and registers 424 responsive to allocating registers 422 to plane 410 and registers 424 to plane 412. The trim values loaded to registers 422 and 424 can correspond to an amount of slow charge loss exhibited by memory cells at planes 410 and 412 immediately or soon after data is programmed to the respective planes. In some embodiments, the trim values loaded to registers 422 and 424 can correspond to default trim values that are associated with one or more planes at memory device 130, 140. The default trim values can be trim values that are used to perform plane-based operations for planes including memory cells that have not exhibited slow charge loss, in some embodiments. Accordingly, in some embodiments, the default trim values can correspond to default voltage settings for performing operations (e.g., programming operations, read operations, etc.) at each plane of memory device 130, 140.

In other or similar embodiments, trim manager component 113 can load trim values to registers 422 and registers 424 responsive to receiving a request to perform an operation for memory cells at a respective plane 410, 412 (e.g., a single-plane operation, a multi-plane operation, etc.). In such embodiments, the trim values loaded to registers 422 and registers 424 can correspond to the current voltage distribution at memory cells of the respective planes 410, 412 (i.e., caused by slow charge loss of the memory cells since the memory cells were programmed). For example, as described above, memory sub-system controller 115 can program data to plane 410 at a first time period and data to plane 412 at a second time period. Trim manager component 113 can receive the multi-plane operation at a third time period (referred to as a current time period herein). In response to receiving the request to perform the multi-plane operation for data at first plane 410 and second plane 412, processing logic can load the first set of trim values (i.e., corresponding to the voltage shift between the first time period and the current time period) to registers 422 and the second set of trim values (i.e., corresponding to the voltage shift between the second time period and the current time period) to registers 424.

In some embodiments, trim manager component 113 can obtain the trim values associated with planes 410 and 412 from a trim value data structure. Each entry of the trim value data structure can include an indication of a trim value associated with a logical level of memory cells at memory devices 130, 140 and a voltage shift present for the respective logical level of the memory cells. In some embodiments, the trim values included in the trim value data structure can be determined based on experimental and/or testing data collected for one or more memory devices 130, 140 at memory sub-system 110 (or at another memory sub-system 110). The experimental and/or testing data can be collected during fabrication, initialization, or run-time of the one or more memory devices 130, 140.

At operation 614, processing logic determines a current voltage shift for data residing at the one or more first planes. In some embodiments, processing logic can determine the current voltage shift for data residing at first plane 410 during execution of a calibration process. For example, in some embodiments, one or more components of memory sub-system controller 115 (e.g., trim manager component 113, etc.) can initiate a calibration process to determine a current voltage shift for memory cells at first plane 410. During the calibration process, processing logic can perform one or more operations to determine the current voltage distribution for data stored at memory cells of first plane 410. For example, processing logic can measure the current voltage distribution for the data at memory cells of the first plane 410. Processing logic can determine the current voltage shift for the memory cells by determining a difference between the current voltage distribution and a prior voltage distribution for the data at the memory cells (e.g., when the data was programmed to the memory cells) of first plane 410. In some embodiments, memory sub-system controller 115 can initiate the calibration process periodically (e.g., in accordance with a calibration protocol associated with memory sub-system 110). In other or similar embodiments, memory sub-system controller 115 can initiate the calibration process in response to determining that an error criterion associated with first plane 410 is satisfied. For example, in response to determining that a bit error rate associated with data read from first plane 410 (e.g., during a single-plane read operation, during a multi-plane read operation, etc.) exceeds a threshold bit error rate, memory sub-system controller 115 can initiate a calibration process to determine the voltage shift for the data residing at first plane 410, as described above.

At operation 616, processing logic determines whether a voltage shift criterion is satisfied. In some embodiments, processing logic can determine that the voltage shift criterion is satisfied by determining that the current voltage shift for the data residing at the one or more first planes exceeds a threshold voltage shift. The threshold voltage shift can be defined (e.g., by experimental data, by memory sub-system runtime data, etc.) to be a particular voltage shift associated with memory cells such that an error rate for operations performed for the memory cells using a current set of trim values (i.e., the first set of trim values for the one or more first planes) is expected to exceed a threshold error rate. If the processing logic determines that the voltage shift criterion for the memory cells is not satisfied, the error rate for operations performed for the memory cells using the current set of trim values is not expected to exceed the threshold error rate.

Responsive to processing logic determining that the voltage shift criterion is satisfied, method 600 can proceed to operation 618. At operation 618, processing logic updates the first set of trim values at the first trim registers to correspond to the current voltage shift for the data residing at the one or more first planes. In some embodiments, processing logic can obtain one or more trim values from the trim value data structure that corresponds to the current amount or voltage shift present for the memory cells of the one or more first planes. In response to obtaining the one or more trim values from the trim value data structure, processing logic can replace one or more trim values from the set of trim values at the first trim registers to correspond to the obtained one or more trim values. In other or similar embodiments, processing logic can update the first set of trim values using a trim value function associated with one or more planes of memory device 130, 140. For example, processing logic can provide, as input to the trim value function, the first set of trim values at the first trim registers and the current voltage shift for the data residing at the one or more first planes. Processing logic can obtain, as an output of the trim value function, an indication of one or more trim values that correspond to the current voltage shift for the data residing at the one or more first planes. Processing logic can update the first set of trim values at the first set of trim registers in view of the trim values obtained from the output of the trim value function, in some embodiments.

In response to updating the first set of trim values at the first set of trim registers, processing logic can perform one or more operations (e.g., single-plane operations, multi-plane operations, etc.) for the one or more first planes using the updated first set of trim values. For example, processing logic can receive a request to perform a multi-plane operation for data residing at first plane 410 and data residing at second plane 412, as described above. Processing logic can perform the multi-plane operation for the data residing at the first plane 410 using the updated first set of trim values and the data residing at the second plane 412 using the second set of trim values, in accordance with previously described embodiments.

Responsive to processing logic determining that the voltage shift criterion is not satisfied, method 600 can return to operation 614. By method 600 returning to operation 614, processing logic does not update the first set of trim values associated with the one or more first planes, in some embodiments. In such embodiments, processing logic can perform one or more operations (e.g., single-plane operations, multi-plane operations, etc.) for data residing at the one or more first planes using the first set of trim values, as described above.

Referring back to operation 614, it should be noted that in some embodiments, one or more components of memory sub-system controller 115 (e.g., trim manager component 113, etc.) can initiate a calibration process to measure the current voltage shift for memory cells at the one or more second planes. In some embodiments, memory sub-system controller 115 can initiate the calibration process for the memory cells at the one or more second planes before or after the calibration process is initiated for the one or more first planes. In other or similar embodiments, memory sub-system controller 115 can initiate the calibration process for the memory cells at the one or more second planes at the same time or at approximately the same time that the calibration process is initiated for the one or more first planes. For example, in some embodiments, memory sub-system controller 115 can initiate the calibration process for each plane at a particular memory device 130, 140, which can include the one or more first planes and the one or more second planes. Processing logic can update the second set of trim values at the second set of trim registers to correspond with the current voltage shift for the data residing at the one or more second planes responsive to determining that the voltage shift criterion is satisfied, in accordance with embodiments described above.

Figure 7:
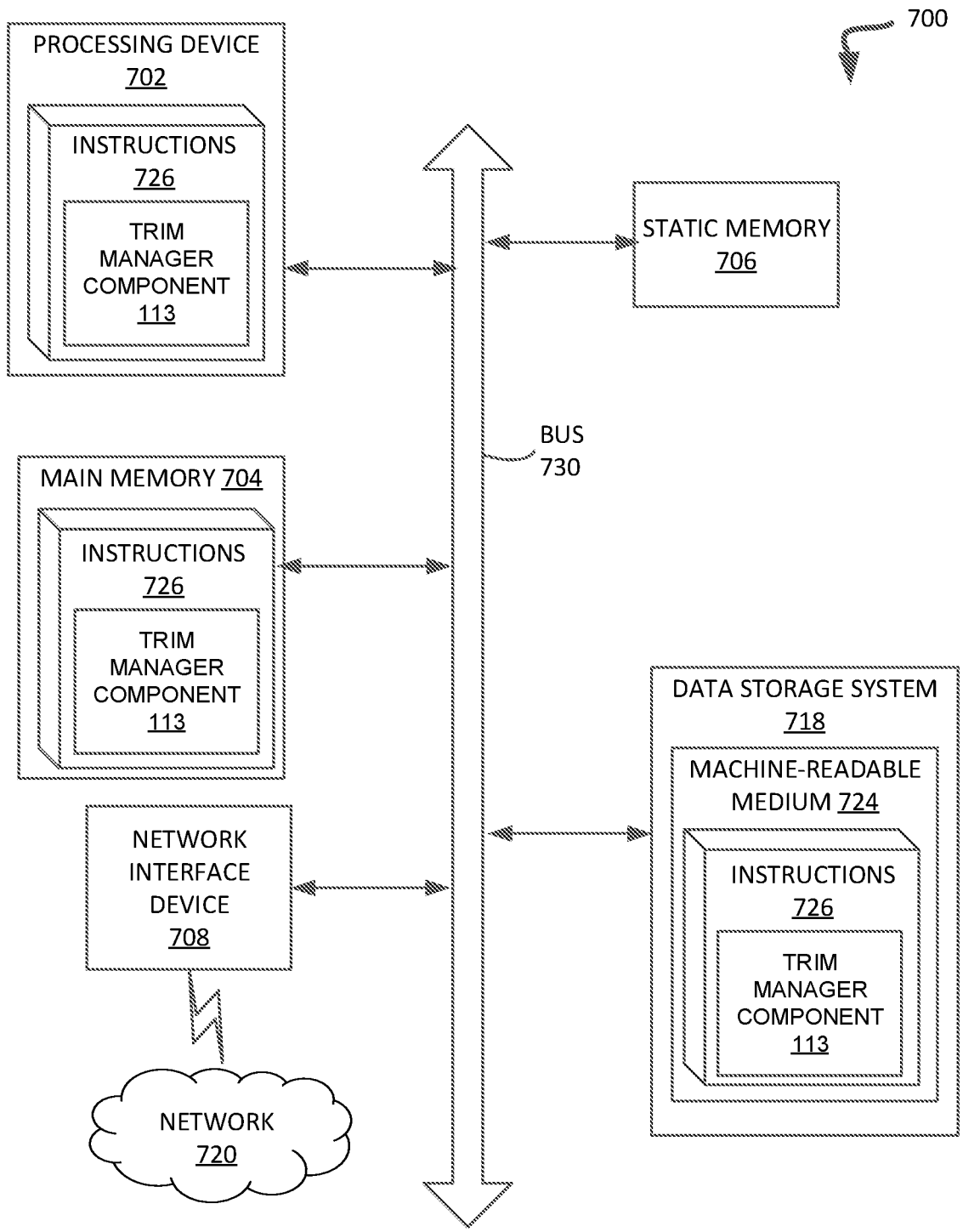
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the trim manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 1108 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a voltage bin boundary component (e.g., the trim manager component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    performing, by a processing device, a calibration process to determine a first voltage shift at a first plane of a memory device and a second voltage shift at a second plane of the memory device at a first time period, wherein the first voltage shift is between a first voltage distribution observed at the first plane during the first time period and a second voltage distribution observed at the second plane during a second time period, and wherein the second voltage shift is between a third voltage distribution observed at the second plane during the first time period and a fourth voltage distribution observed at the second plane during a third time period;
    receiving, by the processing device, a request to perform a multi-plane operation with respect to first data residing on the first plane of the memory device and second data residing on the second plane of the memory device;
    responsive to the request, identifying a first set of registers allocated to store a first set of trim values associated with the first plane and a second set of registers allocated to store a second set of trim values associated with the second plane;
    retrieving, by the processing device, the first set of trim values loaded to the first set of registers of the memory device based on the calibration process, wherein the first set of trim values corresponds to the first voltage shift determined based on the calibration process;
    retrieving, by the processing device, the second set of trim values loaded to the second set of registers based on the calibration process, wherein the second set of trim values corresponds to the second voltage shift determined based on the calibration process; and
    performing, by the processing device, the multi-plane operation using the first set of trim values for the first data at the first plane and the second set of trim values for the second data at the second plane.

2. The method of claim 1, further comprising:
    determining a temperature difference between a current temperature of the memory device and at least one of a first temperature of the memory device during the first time period or a second temperature of the memory device during the second time period; and
    determining, based on the temperature difference, a third set of trim values corresponding to a third voltage shift for the data stored at the first plane and the data stored at the second plane, wherein the multi-plane operation is further performed using the third set of trim values for the data at the first plane and for the data at the second plane.

3. The method of claim 1, further comprising:
determining a first temperature difference between a current temperature of the memory device and the first temperature of the memory device during the first time period;
determining a second temperature difference between the current temperature of the memory device and the second temperature of the memory device during the second time period;
determining, based on the first temperature difference, a third set of trim values corresponding to a third voltage shift for the data stored at the first plane; and
determining, based on the second temperature difference, a fourth set of trim values corresponding to a fourth voltage shift for the data stored at the second plane,
wherein the multi-plane operation is further performed using the third set of trim values for the data at the first plane and the fourth set trim values for the data at the second plane.

4. The method of claim 1, wherein the first set of registers is exclusively associated with the first plane and the second set of registers is exclusively associated with the second plane.

5. The method of claim 1, wherein the first set of registers is exclusively associated with a first plurality of planes of the memory device, the first plurality of planes comprising the first plane.

6. The method of claim 1, wherein the multi-plane operation comprises a multi-plane read operation.

7. A system comprising:
a memory device comprising a plurality of planes; and
a processing device coupled to the memory device, the processing device to perform operations comprising:
  receiving a request to perform a calibration process to determine trim values associated with one or more first planes of the plurality of planes and additional trim values associated with one or more second planes of the plurality of planes;
  responsive to the request:
    loading a first set of trim values to a first set of trim registers allocated to the one or more first planes of the plurality of planes, wherein the first set of trim values corresponds to an initial voltage shift for first data programmed to the one or more first planes during a first time period; and
    loading a second set of trim values to a second set of trim registers allocated to the one or more second planes of the plurality of planes, wherein the second set of trim values corresponds to an initial voltage shift for second data programmed to the one or more second planes during a second time period;
  determining a current voltage shift for the first data based on a first voltage distribution measured at the one or more first planes during the first time period and a current voltage distribution observed at the one or more first planes during a current time period; and
  responsive to determining that the current voltage shift for the first data satisfies a voltage shift criterion, updating the first set of trim values at the first set of trim registers to correspond to the current voltage shift for the first data.

8. The system of claim 7, wherein the operations further comprise:

determining a current voltage shift for the second data between the second time period and a current time period; and
responsive to determining that the current voltage shift for the second data satisfies the voltage shift criterion, updating the second set of trim values at the second set of trim registers to correspond to the current voltage shift for the second data.

9. The system of claim 8, wherein the current voltage shift for at least one of the first data or the second data is determined during a performance of a calibration operation for one or more memory pages at one or more of the one or more first planes or the one or more second planes.

10. The system of claim 7, wherein determining the current voltage shift for the first data comprises:
determining a current voltage distribution for the first data; and
determining a difference between the current voltage distribution for the first data during the current time period and a prior voltage distribution for the first data during the first time period, wherein the current voltage shift for the data corresponds to the determined difference.

11. The system of claim 7, wherein determining that the current voltage shift for the first data satisfies the voltage shift criterion comprises:
determining that the current voltage shift exceeds a threshold voltage shift associated with the one or more first planes.

12. The system of claim 7, further comprising:
performing a multi-plane operation using the updated set of trim values for the first data residing at the one or more first planes and the second set of trim values for the second data residing at the one or more second planes.

13. A non-transitory computer-readable storage medium comprising instructions that, when executed by a processing device, cause the processing device to perform operations comprising:
performing a calibration process to determine a first voltage shift at a first plane of a memory device and a second voltage shift at a second plane of the memory device at a first time period, wherein the first voltage shift is between a first voltage distribution observed at the first plane during the first time period and a second voltage distribution observed at the second plane during a second time period, and wherein the second voltage shift is between a third voltage distribution observed at the second plane during the first time period and a fourth voltage distribution observed at the second plane during a third time period;
receiving a request to perform a multi-plane operation with respect to first data residing on the first plane of a memory device and second data residing on the second plane of the memory device;
responsive to the request, identifying a first set of registers allocated to store a first set of trim values associated with the first plane and a second set of registers allocated to store a second set of trim values associated with the second plane;
retrieving the first set of trim values loaded to a first set of registers of the memory device based on the calibration process, wherein the first set of trim values corresponds to the first voltage shift determined based on the calibration process;
retrieving the second set of trim values loaded to the second set of registers based on the calibration process, wherein the second set of trim values corresponds to the second voltage shift determined based on the calibration process; and performing the multi-plane operation using the first set of trim values for the first data at the first plane and the second set of trim values for the second data at the second plane.

14. The non-transitory computer-readable storage medium of claim 13, wherein the operations further comprise:

determining a temperature difference between a current temperature of the memory device and at least one of a first temperature of the memory device during the first time period or a second temperature of the memory device during the second time period; and determining, based on the temperature difference, a third set of trim values corresponding to a third voltage shift for the data stored at the first plane and the data stored, wherein the multi-plane operation is further performed using the third set of trim values for the data at the first plane and for the data at the second plane.

15. The non-transitory computer-readable storage medium of claim 13, wherein the operations further comprise:

determining a first temperature difference between a current temperature of the memory device and the first temperature of the memory device during the first time period;

determining a second temperature difference between the current temperature of the memory device and the second temperature of the memory device during the second time period;

determining, based on the first temperature difference, a third set of trim values corresponding to a third voltage shift for the data stored at the first plane; and determining, based on the second temperature difference, a fourth set of trim values corresponding to a fourth voltage shift for the data stored at the second plane, wherein the multi-plane operation is further performed using the third set of trim values for the data at the first plane and the fourth set trim values for the data at the second plane.

16. The non-transitory computer-readable storage medium of claim 13, wherein the first set of registers is exclusively associated with the first plane and the second set of registers is exclusively associated with the second plane.

17. The non-transitory computer-readable storage medium of claim 13, wherein the first set of registers is exclusively associated with a first plurality of planes of the memory device, the first plurality of planes comprising the first plane.

18. The non-transitory computer-readable storage medium of claim 13, wherein the multi-plane operation comprises a multi-plane read operation.

* * * * *